United States Patent [19]
Sato et al.

[11] Patent Number: 6,042,988

[45] Date of Patent: Mar. 28, 2000

[54] CHEMICAL-AMPLIFICATION-TYPE NEGATIVE RESIST COMPOSITION

[75] Inventors: Mitsuro Sato, Hillsboro, Oreg.; Katsumi Oomori, Kanagawa, Japan; Etsuko Iguchi, Tokyo, Japan; Kiyoshi Ishikawa, Kanagawa, Japan; Fumitake Kaneko, Kanagawa, Japan; Yoshiki Sugeta, Kanagawa, Japan

[73] Assignee: Tokyo Ohka Kogyo Co., Ltd., Kanagawa, Japan

[21] Appl. No.: 09/161,778

[22] Filed: Sep. 29, 1998

Related U.S. Application Data

[63] Continuation-in-part of application No. 08/997,050, Dec. 23, 1997, abandoned.

[30] Foreign Application Priority Data

Dec. 26, 1996 [JP] Japan .................................. 8-347975

[51] Int. Cl.⁷ .................................................. G03C 1/492
[52] U.S. Cl. ...................... 430/270.1; 430/919; 430/921
[58] Field of Search ............................... 430/270.1, 919, 430/921

[56] References Cited

U.S. PATENT DOCUMENTS

| | | | |
|---|---|---|---|
| 5,034,304 | 7/1991 | Feely | 430/270 |
| 5,164,278 | 11/1992 | Brunsvold et al. | 430/176 |
| 5,204,225 | 4/1993 | Feely | 430/325 |
| 5,227,276 | 7/1993 | Roeschert et al. | 430/252 |
| 5,403,695 | 4/1995 | Hayase et al. | 430/19 |
| 5,529,885 | 6/1996 | Ochiai et al. | 430/370.1 |
| 5,580,695 | 12/1996 | Murata et al. | 430/270.1 |
| 5,658,706 | 8/1997 | Niki et al. | 430/270.1 |
| 5,731,125 | 3/1998 | Yamachika et al. | 430/270.1 |
| 5,736,297 | 4/1998 | Roeschert et al. | 430/270.1 |
| 5,866,299 | 2/1999 | Szmanda et al. | 430/281.1 |
| 5,902,713 | 5/1999 | Hada et al. | 430/270.1 |

FOREIGN PATENT DOCUMENTS

| | | |
|---|---|---|
| 537524 | 4/1993 | European Pat. Off. . |
| 558280 | 9/1993 | European Pat. Off. . |
| 749046 | 12/1996 | European Pat. Off. . |
| 5-127369 | 5/1993 | Japan . |
| 5-289322 | 11/1993 | Japan . |
| 7-92678 | 4/1995 | Japan . |
| 7-92679 | 4/1995 | Japan . |

OTHER PUBLICATIONS

CRC Handbook of Chemistry and Physics, 77th Ed., Lide, D.R. ed., CRC Press, NY, 1996, pp. 8–43,44,46,47,51.

*Primary Examiner*—Janet Baxter
*Assistant Examiner*—Rosemary Ashton
*Attorney, Agent, or Firm*—Sughrue, Mion, Zinn, Macpeak & Seas, PLLC

[57] ABSTRACT

The present invention provides a chemical-amplification-type negative resist composition containing an alkali-soluble resin, a compound capable of generating an acid by irradiation and a crosslinking agent, and the resist composition of the present invention is characterized in that it further contains an organic carboxylic acid compound as an acidic compound and an organic amine compound as an alkaline compound. According to the content of such acidic and alkaline compounds, the negative resist composition achieves a negative resist pattern exhibiting improved definition and an excellent profile with a reduced dependency on the type of substrate as well as a minimized change in the sensitivety and film thickness with the passage of time and a satisfactory PEG margin, and therefore, the negative resist composition of the present invention can be used in the field of manufacturing electronic parts such as semiconductor devices and liquid-crystal display devices, where finer and more precise processing is increasingly required.

15 Claims, No Drawings

CHEMICAL-AMPLIFICATION-TYPE NEGATIVE RESIST COMPOSITION

This is a Continuation-in-Part of application Ser. No. 08/997,050 filed Dec. 23, 1997, now abandoned.

BACKGROUND OF THE INVENTION

1. Field of the Invention

The present invention relates to a chemical-amplification-type negative resist composition which can be suitably used in the field of manufacturing electronic parts such as semiconductor devices and liquid-crystal display devices, can be developed under an alkaline condition, is capable of achieving a resist pattern exhibiting excellent definition and profile, exhibits consistent performance which is less dependent on the type of substrate the negative resist composition and achieves a minimized change in the sensitivety and film thickness with the passage of time and a satisfactory PEG margin.

2. Description of the Related Art

Resists used in the field of manufacturing electronic parts such as semiconductor devices and liquid-crystal display devices may be a positive type or a negative type. With the former, when the resist is developed, the portion irradiated with active rays is removed, thus forming a positive pattern. With the latter, the non-irradiated portion is removed, thus forming a negative pattern. As one such negative resist, a chemical-amplification-type negative resist has been known which principally consists of an alkali-soluble resin, a compound capable of generating an acid by irradiation, and a crosslinking agent.

For example, Japanese Patent Laid-Open No. 62-164045 discloses a negative photoresist principally consisting of an acid-setting resin system and a photo-acid-generating agent contained at in amount sufficient to form a thermostable negative image and selected from the group of halogenated organic compounds, and characterized in that the halogenated organic compound selectively absorbs chemical rays within the range from 210 to 299 nm, has miscibility with the acid-setting resin, can be developed in an alkaline solution, and is capable of generating a halide acid when irradiated with far-ultraviolet rays for crosslinking the acid-setting resin, under an increasing temperature.

Further, Japanese Patent Laid-Open No. 7-146556 discloses a negative photosensitive composition principally consisting of an alkali-soluble resin, a photo-acid-generating agent system, and a crosslinking agent which acts on the alkali-soluble resin under acidic conditions, and characterized in that the crosslinking agent is a higher-alkyl-type alkoxymethylmelamine resin, and the monomer content of the alkoxymethylmelamine resin is 5 to 40% by weight.

In these chemical-amplification-type negative photoresist compositions, an image is formed by the catalytic activity of the acid generated by irradiation, the sensitivity is high, and a resist pattern exhibiting high resolution can be obtained by alkali development. Because of such advantages, they are suitably used in the field of manufacturing electronic parts where finer processing is increasingly required, and particularly, for manufacturing semiconductor devices and liquid-crystal display devices.

Such resists of the related arts, however, can no any longer sufficiently satisfy the resolution level recently required in the field of manufacturing electronic parts, and cannot achieve a pattern exhibiting an excellent profile. In addition to these problems, such resists are dependent on the substrate, and such a dependency causes a problem in the practical use of the resist since the resist properties vary in relation to the type of substrate used.

An object of the present invention is to provide a chemical-amplification-type negative resist which exhibits further improved resolution and an excellent profile, and which has a reduced dependency on the type of substrate.

Furthermore, a chemical-amplification-type photoresist containing a carboxylic acid and an amine is proposed in EP749046A1, but this is a positive photoresist.

As described in the claims of the aforementioned EP publication, such a positive photoresist principally consists of a photo-acid-generating agent capable of generating an acid by irradiation, and a resin ingredient, which solubility in an alkaline aqueous solution is enhanced by the activity of an acid. The resin ingredient includes a polyhydroxystyrene having hydroxy groups each protected by a group (hereinafter simply referred to as protective group) capable of suppressing solubility to an alkali and dissociating by the activity of the acid.

According to this principle composition, the protective groups of the initially alkali-insoluble resin ingredient in the portion irradiated with active rays are dissociating according to the activity of the acid generated by irradiation and the resin ingredient changes to alkali-soluble, and to the contrary, the non-irradiated portion remains insoluble in an alkali. Thus the irradiated portion is removed when developed to form a positive pattern.

On the contrary, as aforementioned, a chemical-amplification-type negative resist principally consists of a photo-acid-generating agent, an alkali-soluble resin, and a crosslinking agent, and in the irradiated portion the alkali-soluble resin and the crosslinking agent are crosslinked according to the activity of the acid generated by irradiation, thus the irradiated portion changes from alkali-soluble to alkali-insoluble, whereas the non-irradiated portion remains alkali-soluble, which phenomena is opposite to that in a positive photoresist. Thus, the non-irradiated portion is removed to form a negative pattern.

As the crosslinking agent, melamine resins, urea resins and other amino resins each having a hydroxymethyl group or an alkoxymethyl group in the N-position are employed. Whereas these resins are excellent in crosslinking properties in the presence of an acid, they are unstable in a resist composition solution and their sensitivity and thickness of the resultant resist film obtained by application (hereinafter simply referred to as "film thickness") are liable to change with the passage of time.

In the manufacturing of semiconductor devices, manufacturing lines are operated for mass production each in accordance with a predetermined sensitivity and film thickness, deviations in sensitivity and/or film thickness deteriorate productivity of semiconductor devices.

Further, dissociation of protective groups or crosslinking according to the activity of an acid of a positive or negative chemical-amplification-type resist respectively occurs during post exposure baking treatment (hereinafter briefly referred to as "PEB"), so that the PEB largely affects the resolution and the shape of resist pattern.

In particular, since the negative photoresist has a large dependency of crosslinking reaction on the temperature of PEB, a deviation from a given temperature of PEB increases the difference in dimensions between a mask pattern and a resultant resist pattern.

Accordingly, demands have been made to provide a negative photoresist having a reduced PEB-dependency, that is, an excellent PEB margin which can provide a desired size of resist pattern within as wide a range of PEB temperature as possible.

Therefore, another object of the invention is to provide a chemical-amplification-type negative resist which has a minimized change in the sensitivity and film thickness and has a satisfactory PEB margin.

SUMMARY OF THE INVENTION

The Inventors earnestly conducted several studies to improve the physical properties of such a chemical-amplification-type negative resist which principally consists of an alkali-soluble resin, a compound capable of generating acid by irradiation, and a crosslinking agent. As a result, they found that the object can be achieved by further adding an organic carboxylic acid compound and an organic amine compound; the present invention has been accomplished based on this finding.

More specifically, the present invention provides a chemical-amplification-type negative resist composition comprising:

(A) an alkali-soluble resin;

(B) a compound capable of generating an acid by irradiation; and (C) a crosslinking agent; wherein the composition further comprises, (D) an organic carboxylic acid compound; and (E) an organic amine compound.

DETAILED DESCRIPTION OF THE INVENTION

The chemical-amplification-type negative resist composition of the present invention is further illustrated in detail below.

Examples of the alkali-soluble resin used as the ingredient (A) of the resist composition of the present invention include phenol-novolak resins, cresol-novolak resins, copolymers of styrene and maleic anhydride, and polyhydroxystyrenes and derivatives thereof. Polyhydroxystyrenes and derivatives thereof may include: single polymers of vinylphenol; copolymers of vinylphenol and an acrylate derivative, acrylonitrile, a methacrylate derivative, methacrylonitrile, styrene, or a styrene derivative such as α-methylstyrene, p-methylstyrene, o-hydrogenated resins derived from single polymers of vinylphenol; and hydrogenated resins derived from copolymers of vinylphenol and the above-described acrylate derivative, methacrylate derivative, or styrene derivative. Also, substituted polyhydroxystyrenes, in which the hydrogen atoms of some of the hydroxyl groups in the original polyhydroxystyrene have been replaced with alkali-solubility-suppressing groups, can be suitably used.

Such alkali-solubility-suppressing groups may be, for example, tert-butyl groups, tert-butoxycarbonyl groups, tert-aminooxycarbonyl groups, ethoxyethyl groups, methoxypropyl groups, tetrahydropyranyl groups, tetrahydrofuranyl groups, benzyl groups, or trimethylsilyl groups, though tert-butoxycarbonyl groups are advantageous since the balance between acid-decomposability and alkali-solubility-suppressing activity is satisfactory for achieving an excellent resist-pattern form. Further, the substitution ratio of such acid-decomposable alkali-solubility-suppressing groups in polyhydroxystyrene is selected within a range from 1 to 45 mole %. A substitution ratio higher than this range is unsuitable since the resist composition becomes slightly alkali-soluble, thus the portion of the resist noy irradiated with active rays, cannot always be completely developed and it becomes difficult to obtain the desired image.

Additionally, sulfonic acid esters or carbonic acid esters of polyhydroxystyrene-type resins in which the hydrogen atoms of some of the hydroxy groups in the original polyhydroxystyrene have been replaced with p-acetaminobenzenesulfonyl groups, benzenesulfonyl groups, p-chlorobenzenesulfonyl groups, naphthylbenzenesulfonyl groups, p-acetaminobenzenecarbonyl groups, benzenecarbonyl groups, p-chlorobenzenecarbonyl groups, naphthylbenzenecarbonyl groups, and/or other groups, can also be suitably used as the alkali-soluble resin.

Among such alkali-soluble resins, cresol-novolak resins, polyhydroxystyrenes and the hydrogenated resins derived therefrom, substituted polyhydroxystyrenes in which 1 to 45 mole % of hydrogen atoms of the hydroxyl groups of the original polyhydroxystyrene have been replaced with tert-butoxycarbonyl groups, copolymers of p-hydroxystyrene and styrene, and the hydrogenated resins derived from copolymers are preferred. Of these, copolymers of hydroxystyrene and styrene, having 5 to 25 mol % of styrene unit, are preferred. These alkali-soluble resins may each be used alone or in combination with one or more of the others.

Next, the ingredient (B) in the resist composition of the present invention, which is a compound capable of generating an acid by irradiation, is selected from compounds which are ordinarily used as a photo-acid-generating agent in a conventional chemical-amplification-type resist.

Examples of such compounds include:

bissulfonyldiazomethanes such as bis(p-toluenesulfonyl) diazomethane, bis(1,1-dimethylethylsulfonyl) diazomethane, bis(cyclohexylsulfonyl)diazomethane, p-bis(2,4-dimethylphenylsulfonyl)diazomethane;

nitrobenzyl derivatives such as 2-nitrobenzyl p-toluenesulfonate, 2,6-dinitrobenzyl p-toluenesulfonate, and 2,4-dinitrobenzyl p-trifluoromethylbenzenesulfonate;

aliphatic- or aromatic-sulfonic esters of pyrogallol such as methanesulfonic ester of pyrogallol, benzenesulfonic ester of pyrogallol, and p-toluenesulfonic ester of pyrogallol;

onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, and (p-tert-butylphenyl) diphenylsulfonium trifluoromethanesulfonate;

benzoin tosylates such as benzoin tosylate, and α-methylbenzoin tosylate;

halogen-containing triazines such as 2-(4-methoxyphenyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine, tris(2,3-dibromopropyl)-1,3,5-triazine, and tris(2,3-dibromopropyl) isocyanurate;

oxime-sulfonate-type compounds such as α-(toluenesulfonyloximino)-phenylacetonitrile, α-(p-chlorobenzenesulfonyloximino)-phenylacetonitrile, α-(4-nitrobenzenesulfonyloximino)-phenylacetonitrile, α-(4-nitro-2-trifluoromethylbenzenesulfonyloximino)-phenylacetonitrile, α-(benzenesulfonyloximino)-4-chlorophenylacetonitrile, α-(benzenesulfonyloximino)-2,4- dichlorophenylacetonitrile, α-(benzenesulfonyloximino)-2,6-dichlorophenylacetonitrile, α-(benzenesulfonyloximino)-4-methoxyphenylacetonitrile, α-(2-chlorobenzenesulfonyloximino)-4-methoxyphenylacetonitrile, α-(benzenesulfonyloximino)-2-thienylacetonitrile, α-(4-dodecylbenzenesulfonyloximino)-phenylacetonitrile, α-(4-toluenesulfonyloximino)-4-methoxyphenylacetonitrile, α-(4-dodecylbenzenesulfonyloximino)-4-methoxyphenylacetonitrile, α-(4-toluenesulfonyloximino)-3-thienylacetonitrile, α-(methylsulfonyloximino)-phenylacetonitrile, α-(methylsulfonyloximino)-4-methoxyphenylacetonitrile, α-(trifluoromethylsulfonyloximino)-phenylacetonitrile, α-(trifluoromethylsulfonyloximino)-4-methoxyphenylacetonitrile, α-(ethylsulfonyloximino)-4-methoxyphenylacetonitrile, α-(propylsulfonyloximino)-4-methylphenylacetonitrile, α-(methylsulfonyloximino)-4-bromophenylacetonitrile, α-(methylsulfonyloximino)-1-cyclopentenylacetonitrile, α-(methylsulfonyloximino )-1-cyclohexenylacetonitrile, α-(methylsulfonyloximino)-1-cycloheptenylacetonitrile, a-(methylsulfonyloximino)-1-cyclooctenylacetonitrile, α-(trifluoromethylsulfonyloximino)-1-cyclopentenylacetonitrile, α-(trifluoromethylsulfonyloximino)-1-cyclohexenylacetonitrile, α-(ethylsulfonyloximino)-ethylacetonitrile, α-(propylsulfonyloximino)-propylacetonitrile, α-(cyclohexylsulfonyloximino)-cyclopentylacetonitrile, α-(cyclohexylsulfonyloximino)-cyclohexylacetonitrile, α-(cyclohexylsulfonyloximino)-1-cyclopentenylacetonitrile, α-(1-naphthylsulfonyloximino)-4-methoxybenzyl cyanide, α-(2-naphthylsulfonyloximino)-4-methoxybenzyl cyanide, α-(1-naphthylsulfonyloximino) benzyl cyanide, α-(2-naphthylsulfonyloximino)benzyl cyanide, α-(10-camphorsulfonyloximino)-4-methoxybenzyl cyanide, α-(10-camphorsulfonyloximino)benzyl cyanide, α-(3-camphorsulfonyloximino)-4-methoxybenzyl cyanide, and α-(3-bromo-10-camphorsulfonyloximino)-4-methoxybenzyl cyanide; dicarboximide sulfonates such as N-methylsulfonyloxysuccinimide, N-isopropylsulfonyloxysuccinimide, N-chloroethylsulfonyloxysuccinimide, N-(p-methoxyphenyl)sulfonyloxysuccinimide, N-(p-vinylphenyl)sulfonyloxysuccinimide, N-naphthylsulfonyloxysuccinimide, N-phenylsulfonyloxysuccinimide, N-(2,4,6-trimethylphenyl)sulfonyloxysuccinimide, N-methylsulfonyloxymaleimide, N-isopropylsulfonyloxymaleimide, N-chloroethylsulfonyloxymaleimide, N-(trifluoromethylsulfonyloxy) naphthylimide, N-(p-methoxyphenyl )sulfonyloxymaleimide, N-(p-vinylphenyl) sulfonyloxymaleimide, N-naphthylsulfonyloxymaleimide, N-phenylsulfonyloxymaleimide, N-(2,4,6-trirnethylphenyl)sulfonyloxymaleimide, N-methylsulfonyloxyphthalimide, N-isopropylsulfonyloxyphthalimide, N-chloroethylsulfonyloxyphthalimide, N-(p-methoxyphenyl)sulfonyloxyphthalimide, N-(p-vinylphenyl)sulfonyloxyphthalimide, N-naphthylsulfonyloxyphthalimide, N-phenylsulfonyloxyphthalimide, and N-(2,4,6-trimethylphenyl)sulfonyloxyphthalimide; and bisoxime-sulfonate-type compounds represented by the following formulae.

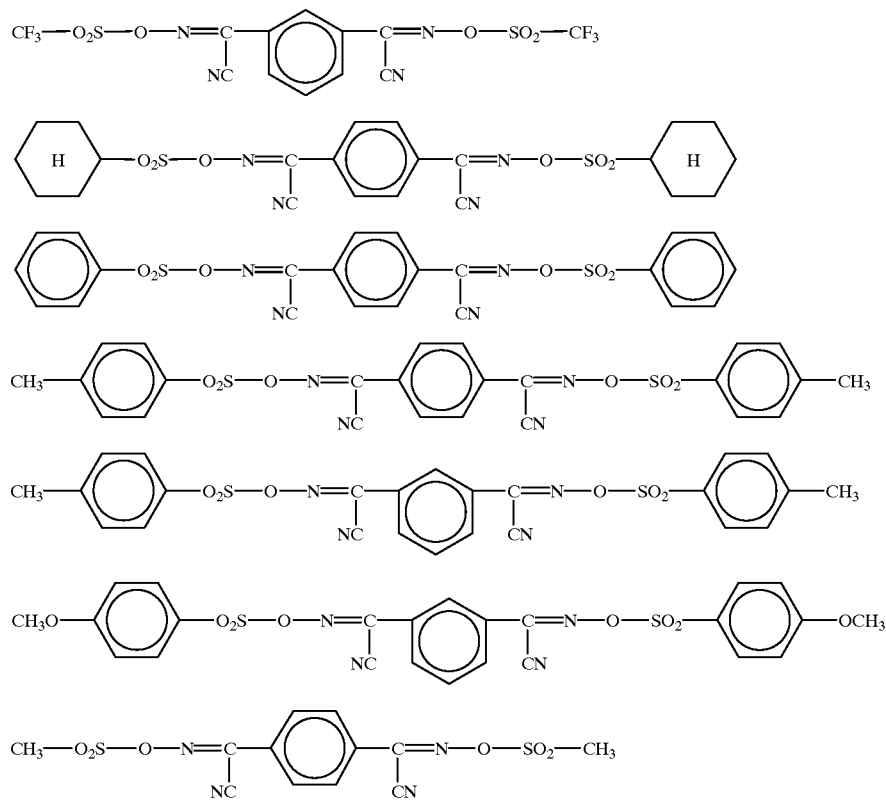

-continued

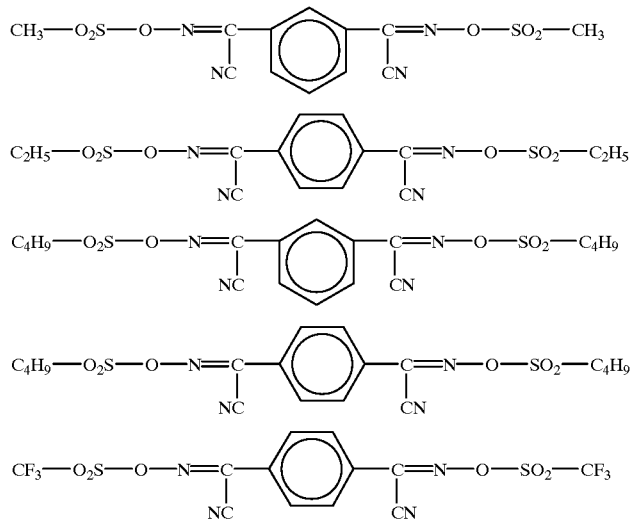

Among the above-listed compounds capable of generating an acid by irradiation (photo-acid-generating agents), for example, tris(2,3-dibromopropyl) isocyanurate, oxim-sulfonate-type compounds are advantageous since those achieve satisfactory sensitivity. Further, α-(methylsulfonyloximino)-phenylacetonitrile, α-(methylsulfonyloximino)-4-methoxyphenylacetonitrile, α-(trifluoromethylsulfonyloximino)-phenylacetonitrile, α-(trifluoromethylsulfonyloximino)-4-methoxyphenylacetonitrile, α-(ethylsulfonyloximino)-4-methoxyphenylacetonitrile, α-(propylsulfonyloximino)-4-methylphenylacetonitrile, α-(methylsulfonyloximino)-4-bromophenylacetonitrile, α-(naphtylsulfonyloximino) benzylcyanide, α-(naphtylsulfonyloximino)-4-methoxyphenylacetonitrile, α-(camphorsulfonyloximino) benzylcyanide, α-(camphorsulfonyloximino) methoxybenzylcyanide, dicarboximide sulfonate-type-compound, N-(p-vinylphenyl)sulfonyloxysuccinimide, N-(p-vinylphenyl)sulfonyloxymaleimide and N-(trifluoromethylsulfonyloxy)naphthylimide and the like, are preferred since they achieve negative resist patterns exhibiting especially high definition.

Each of these photo-acid-generating agents can be used alone or in combination with one or more of the others.

Moreover, as for the ingredient (C) of the resist composition of the present invention, any ordinarily used melamine resin or urea resin in which at least one N position has been N-methylol-modified or N-alkoxymethyl-modified can be used alone or in combination with one or more of the others. Such N-methylol-modified melamine resins or urea resins can be obtained by reacting melamine or urea with formaldehyde in boiling water. On the other hand, N-alkoxymethyl-modified melamine resins or urea resins can be obtained by further reacting the thus obtained N-methylol-modified melamine resin or urea resin with a lower alcohol.

As for the content of each of the ingredients (A), (B) and (C) in the resist composition of the present invention, the content of the ingredient (B) should preferably be within a range of from 0.5 to 20 parts by weight while the content of the ingredient (C) should preferably be within a range of from 3 to 70 parts by weight, respectively, relative to 100 parts by weight of the ingredient (A).

When the content of the ingredient (B) is too low, the sensitivity will be unsuitably lowered. When it is excessive, a uniform resist composition cannot be achieved, and its developing ability will also be unsuitably lowered.

Meanwhile, if the content of the ingredient (C) is lower than the range, a resist pattern can not be formed. If it exceeds the range, the developing ability may be unsuitably lowered.

Next, the resist composition of the present invention further contains an organic carboxylic acid compound as an ingredient (D) and an organic amine compound as an ingredient (E).

The roles of the ingredient (D) (an organic carboxylic acid compound) and the ingredient (E) (an organic amine compound) will be described in detail below. In the present invention, both ingredients (D) and (E) should be incorporated into the composition in order to minimize the changes with the passage of time of the sensitivity and film thickness and to improve PEB margin, in addition to enhancement of resolution and improvement of the shape of pattern with a reduced dependency on the type of substrate.

A chemical-amplification-type negative photoresist provides a resultant resist pattern according to the reaction mechanism mentioned above. Such a negative photoresist has, distinct from a positive photoresist, specific problems as mentioned below:

1) An insufficient crosslinking reaction is liable to occur in the vicinity of a top surface of a resist film so as to form a roundheaded top of a resist pattern;
2) the sensitivity and film thickness change with the passage of time; and
3) Its PEB margin is small.

To resolve the above problems specific to a negative resist, incorporation of both ingredients (D) and (E) is particularly effective.

In the present invention, the organic carboxylic acid compound as an ingredient (D) is not especially limited, and any type of carboxylic acid can be used, such as saturated or unsaturated aliphatic carboxylic acids, alicyclic carboxylic acids, oxycarboxylic acids, alkoxycarboxylic acids, ketocarboxylic acids, and aromatic carboxylic acids. Typical examples include: aliphatic mono- or polycarboxylic acids such as formic acid, acetic acid, propionic acid, butyric acid, isobutyric acid, oxalic acid, malonic acid, succinic acid, glutaric acid, and adipic acid; alicyclic carboxylic acids such as 1,1-cyclohexanedicarboxylic acid, 1,2-cyclohexanedicarboxylic acid, 1,3-cyclohexanedicarboxylic acid, 1,4-cyclohexanedicarboxylic acid, and 1,1-cyclohexyldiacetic acid; unsaturated aliphatic carboxylic acids such as acrylic acid, crotonic acid, isocrotonic acid, 3-butenoic acid, methacrylic acid, 4-pentenoic acid, propiolic acid, 2-butynoic acid, maleic acid, fumaric acid, and acetylenecarboxylic acid; hydroxycarboxylic acids such as hydroxyacetic acid; alkoxycarboxylic acids such as methoxyacetic acid, and ethoxyacetic acid; keto-carboxylic acids such as pyruvic acid; and benzoic acids or benzoic acid derivatives such as p-hydroxybenzoic acid, o-hydroxybenzoic acid, 2-hydroxy-3-nitrobenzoic acid, 3,5-dinitrobenzoic acid, 2-nitrobenzoic acid, 2,4-dinitrobenzoic acid, 2,5-dinitrobenzoic acid, 2,6-dinitrobenzoic acid, 3,5-dinitrobenzoic acid, 2-vinylbenzoic acid, 4-vinylbenzoic acid, phthalic acid, terephthalic acid, and isophthalic acid. Among these, benzoic acids and benzoic acid derivatives are preferred, in particular, o-hydroxybenzoic acid and o-nitrobenzoic acid are preferred.

Each of these organic carboxylic acid compounds may be used alone or in combination with one or more of the others.

On the other hand, as for the ingredient (E), organic amine compounds such as aliphatic amines, aromatic amines, and heterocyclic amines can be suitably used. Typical examples of such aliphatic amines include monoethanolamine, triethanolamine, ethylamine, propylamine, isopropylamine, butylamine, isobutylamine, tert-butylamine, pentylamine, isopentylamine, tert-pentylamine, hexylamine, heptylamine, octylamine, dimethylamine, diethylamine, dipropylamine, diisopropylamine, dibutylamine, trimethylamine, triethylamine, tripropylamine, triisopropylamine, tributylamine, triisobutylamine, tri-tert-butylamine, tripentylamine, triisopentylamine, tri-tert-pentylamine, trihexylamine, triheptylamine, trioctylamine, and the like. Typical examples of such aromatic amines include benzylamine, aniline, N-methylaniline, N,N-dimethylaniline, o-methylaniline, m-methylaniline, p-methylaniline, N,N-diethylaniline, diphenylamine, di-p-tolylamine and the like. Further, typical examples of heterocyclic amines include pyridine, o-methylpyridine, o-ethylpyridine, 2,3-dimethylpyridine, 4-ethyl-2-methylpyridine, 3-ethyl-4-methylpyridine and the like. Among these, aliphatic secondary or tertiary amines having 2 to 6 carbon atoms are preferred, and trialkyl amines such as trimethylamine, triethylamine, tripropylamine, triisopropylamine, tributylamine, triisobutylamine, tri-tert-butylamine, tripentylamine, triisopentylamine, tri-tert-pentylamine, trihexylamine, diethylamine, dipropylamine, diisopropylamine and dibutylamine are particularly suitable since they achieve resist patterns exhibiting high definition and excellent profiles.

Each of these organic amine compounds may be used alone or in combination with one or more of the others.

As for the content of the ingredients (D) and (E), the total content of the ingredients (D) and (E) taken together should preferably be within a range of from 0.01 to 10 parts by weight relative to 100 parts by weight of the ingredient (A), and the content ratio between the ingredient (D) and the ingredient (E) should preferably be within a range of from 10:90 to 90:10 (by weight). With a content of ingredients (D) and (E) that deviates from the above-described range, the stability in terms of time and exposure latitude will be unsuitably lowered.

The resist composition of the present invention containing the above-described ingredients (A), (B), (C), (D), and (E) may, for example, be dissolved in an organic solvent to prepare a solution for a negative resist film, and the solution is preferably applied to a substrate such as a silicon wafer or a glass plate using a conventional application means such as a spinner. Examples of organic solvents used to prepare such a solution for a negative resist film include: ketones such as acetone, methyl ethyl ketone, cyclopentanone, cyclohexanone, methyl isoamyl ketone, 2-heptanone, and 1,1,1-trimethylacetone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, dipropylene glycol monoacetate, monomethyl ethers of these, monoethyl ethers of these, monopropyl ethers of these, monobutyl ethers of these, and monophenyl ethers of these; cyclic ethers such as dioxane; and esters such as methyl lactate, ethyl lactate, methyl acetate, ethyl acetate, butyl acetate, methyl pyruvate, ethyl pyruvate, methyl 3-methoxypropionate, and ethyl 3-ethoxypropionate. Each of these solvents may be used alone or in combination with one or more of the others.

As occasion demands, the solution for a negative resist film may further contain one or more miscible additives such as an additional resin, a plasticizer, a stabilizer, a coloring agent, a surfactant, etc. which are conventionally used to improve the performance of the resist film.

Next, the process of forming a pattern using the resist composition of the present invention is illustrated below. According to conventional lithographic techniques, a negative resist pattern exhibiting an excellent profile can be formed by using the above-described solution for a negative resist film based on the resist composition of the present invention as follows:

such a solution for a negative resist film is applied to a substrate, and dried to form a negative resist film;

the resist film is then selectively irradiated with ultraviolet rays, deep-UV, an excimer laser beam, or X-rays through a mask pattern, or is scanned with electron rays; and after heat treatment, the resist film is developed in a developer solution, for example, an alkaline solution such as an aqueous solution containing 1 to 10% by weight of tetramethylammonium hydroxide.

The present invention will be further illustrated in detail with reference to the examples and comparative examples.

EXAMPLE 1

Initially, a solution for a negative resist film was prepared by dissolving, in 110 g of propylene glycol monomethyl ether acetate, an ingredient (A) being 22.5 g of an alkali-soluble resin which was a copolymer (trade name VPS-2515, manufactured by Nippon Soda Co., Ltd.) consisting of p-hydroxystyrene and styrene in a molar ratio of 85:15 and having a weight average molecular weight of 2,500, an ingredient (B) being 1.3 g of N-(p-vinylphenyl) sulfonyloxymaleimide, an ingredient (C) being 4.0 g of a methylol-modified melamine resin (trade name MW-30, manufactured by Sanwa Chemical Co., Ltd.), an ingredient (D) being 0.16 g of o-hydroxybenzoic acid, and an ingredient (E) being 0.27 g of tripentylamine.

Next, the above-prepared solution for a negative resist film was applied onto a silicon wafer using a spinner, and dried on a hot plate at 100° C. for 90 sec. to form a resist film having a thickness of 0.73 $\mu$m. The resist film was then selectively irradiated with a KrF excimer laser beam using a reducing-type projection aligner NSR-2005EX8A (manufactured by Nikon Corporation), subjected to a post-exposure baking treatment at 120° C. for 90 sec., developed in a 2.38% by weight tetramethylammonium hydroxide aqueous solution for 65 sec., washed with water for 30 sec., and dried to form a negative resist pattern.

The thus-obtained resist pattern had an image consisting of lines and spaces with a width (definition) of 0.24 μm, and the sectional shape satisfactorily comprised rectangles perpendicular to the surface of the substrate.

Meanwhile, in order to evaluate whether such a solution for a negative resist film is dependent on the type of substrate, a resist pattern was formed in the same manner as above on a substrate, the surface of which had been coated with a silicon nitride film.

The thus obtained resist pattern had an image consisting of lines and spaces with a definition of 0.24 μm, and the sectional shape also satisfactorily comprised rectangles perpendicular to the surface of the substrate. Accordingly, it could be concluded that the solution for a negative resist film is not dependent on the type of substrate.

EXAMPLES 2 to 4 and COMPARATIVE EXAMPLES 1 to 3

Solutions for negative resist films were prepared in the same manner as Example 1 except that the ingredient (B) being capable of generating acid by irradiation, the organic carboxylic acid compound being ingredient (D), and the organic amine compound being ingredient (E) were replaced as shown in Table 1 below, respectively. Using thus prepared solutions for negative resist films, resist patterns were respectively formed in the same manner as Example 1, and the obtained resist patterns were evaluated for definition (μm), shape, and dependency on the type of substrate. The results are shown in Table 1.

TABLE 1

|  | Ingredient | | | Evaluation | | |
|---|---|---|---|---|---|---|
|  | (B) | (D) | (E) | Definition | Shape | Dependency on Substrate |
| Example 2 | 2 | 1 | 1 | 0.24 | Good | None |
| Example 3 | 1 | 2 | 2 | 0.24 | Good | None |
| Example 4 | 3 | 1 | 1 | 0.24 | Good | None |
| Comparative Example 1 | 1 | — | — | 0.32 | Bad | Existed |
| Comparative Example 2 | 1 | — | 1 | 0.30 | Good | Existed |
| Comparative Example 3 | 1 | 1 | — | 0.32 | Bad | Existed |

In the above Table 1, regarding the ingredient (B) capable of generating an acid by irradiation, the compound indicated by "1" is N-(p-vinylphenyl)sulfonyloxymaleimide (the content was 1.3 g), the compound indicated by "2" is α-(methylsulfonyloximino)-phenylacetonitrile (the content was 1.06 g), and the compound indicated by "3" is α-(1-naphthylsulfonyloximino)-4-methoxyphenylacetonitrile (the content was 1.3 g). Further, as for the ingredient (D) being an organic carboxylic acid compound, the compound indicated by "1" is o-hydroxybenzoic acid (the content was 0.16 g), and the compound indicated by "2" is o-nitrobenzoic acid (the content was 0.14 g). Moreover, as for the ingredient (E) being an organic amine compound, the compound indicated by "1" is tripentylamine (the content was 0.27 g), and the compound indicated by "2" is tributylamine (the content was 0.14 g).

Moreover, regarding the item "Shape" in Table 1, the evaluation "Good" means that the resist pattern had a sectional shape comprising rectangles perpendicular to the surface of the substrate, and the evaluation "Bad" means that the resist pattern did not result in a sectional shape comprising such rectangles. Further, as for the item "Dependency on Substrate", the evaluation "None" means that there was no difference in "Definition" and "Shape" between resist patterns which were formed on a silicon wafer substrate and a substrate having a silicon-nitride surface film, respectively, in a similar procedure using the solution for a negative resist film. The evaluation "Existed" means that differences were observed in "Definition" and "Shape" between such resist patterns.

EXAMPLE 5

A negative resist pattern was formed in the same manner as Example 1, except that 2.0 g of tris(2,3-dibromopropyl) isocyanurate was used as the ingredient (B), 3.3 g of a methylol-modified melamine resin (trade name MW100LM, manufactured by Sanwa Chemical Co., Ltd.) was used as the ingredient (C), 0.08 g of o-hydroxybenzoic acid was used as the ingredient (D), 0.08 g of triethylamine was used as the ingredient (E), and 150 g of ethyl lactate was used instead of propylene glycol monomethyl ether acetate.

The thus obtained resist pattern ha d an image consisting of lines and spaces with a definition of 0.26 μm, and the sectional shape satisfactorily comprised rectangles perpendicular to the surface of the substrate.

Meanwhile, in order to examine whether such a solution for a negative resist film is dependent on the type of substrate, a resist pattern was formed on a substrate the surface of which had been coated with a silicon nitride film, in the same manner as above. The thus obtained resist pattern had an image consisting of lines and spaces with a definition of 0.26 μm, the sectional shape also satisfactorily comprised rectangles perpendicular to the surface of the substrate. Accordingly, it could be concluded that such a solution for a negative resist film is not dependent on the type of substrate.

EXAMPLE 6

Initially, a solution for a negative resist film was prepared by dissolving, in 600 parts by weight of propylene glycol monomethyl ether acetate, an ingredient (A) being 100 parts by weight of a copolymer consisting of hydroxystyrene and styrene in a ratio of 85:15 by mole and having a weight average molecular weight of 2,500, an ingredient (B) being 5.0 parts by weight of α-(methylsulfonyloxyimino)-phenylacetonitrile, an ingredient (C) being 20 parts by weight of a melamine resin having a hydroxy group or an alkoxy group (trade name Mw-100LM, manufactured by Sanwa Chemical Co., Ltd.), an ingredient (D) being 0.60 part by weight of salicylic acid, an ingredient (E) being 0.33 part by weight of triethylamine, and 1,000 ppm, relative to the total solid contents, of a fluorine-silicone-containing surfactant (trade name R-08, manufactured by Shin-Etsu Chemical Co., Ltd.); and the resultant mixture was filtered through a membrane filter having a pore size of 0.2 μm to give a solution for a negative resist film.

Next, the above-prepared solution for a negative resist film was applied onto a 6-inches silicon wafer using a spinner, and dried on a hot plate at 90° C. for 90 sec. to form a resist film having a thickness of 0.5 μm.

The resist film was then selectively irradiated with an i-line (i-ray 365mm) using a reducing-type projection aligner NSR-2005i10D (manufactured by Nikon Corporation), subjected to post exposure baking treatment (PEB) at 110° C. for 90 sec., paddling-developed in a 2.38% by weight of tetramethylammonium hydroxide aqueous solution for 65 sec., and dried to form a negative resist pattern.

The obtained resist pattern had a limiting-resolution of 0.28 μm, and an image consisting of lines and spaces with a definition of 0.32 μm solved by a factor of 1:1, and the sectional shape satisfactorily comprised of rectangles perpendicular to the surface of the substrate. In addition, changes with the passage of time of the sensitivity and thickness of the applied resist film, and PEB margin were evaluated in the following manner:

Change with the passage of time of sensitivity:

Change Rate of Sensitivity (%)=[(Initial Sensitivity−Sensitivity after Standing)/Initial Sensitivity]×100

In the above formula, the term "Initial Sensitivity" is defined as the exposure which gives a resist pattern of a definition of 0.32 μm obtained by using the aforementioned solution for negative resist film immediately after preparation in the same manner as above.

The term "Sensitivity after Standing" is defined as the exposure which gives a resist pattern of a definition of 0.32 μm obtained by using the aforementioned solution for a negative resist film stored in a brown bottle at 30° C. for 4 weeks after preparation.

Change with the Passage of Time of Film Thickness:

Change Rate of Film Thickness (%)=[(Initial Film Thickness−Film Thickness after Standing)/Initial Film Thickness]×100

In the above formula, the term "Initial Film Thickness" is defined as the thickness of a resist film obtained by applying the above-prepared solution for negative resist film immediately after preparation onto a silicon wafer with a spinner at a spinning rate of 3,000 rpm, and dried at 90° C.

The term "Film Thickness after Standing" is defined as the thickness of a resist film obtained by applying the above-prepared solution for negative resist film which had been stored in a brown bottle at 30° C. for 4 weeks after preparation onto a silicon wafer with a spinner at a spinning rate of 3,000 rpm, and dried at 90° C.

PEB Margin:

A series of resist patterns were formed in the same manner as above except that the temperature of the post exposure baking (110° C.) was changed to 107° C or 113° C., and changes of the size of resist pattern per one degree in the range from 107° C. to 110° C. and in the range from 110° C. to 113° C. were determined.

The results of these evaluations are shown in Table 2.

COMPARATIVE EXAMPLE 4

A solution for a negative resist film was prepared in the same manner as Example 6 except that both salicylic acid and triethylamine were not added to the solution. Using the thus-prepared solution for a negative film, a resist pattern was formed in the same manner as Example 6, and the obtained resist pattern was subjected to evaluation for definition (μm), the shape of resist pattern, change with the passage of time of sensitivity, change with the passage of time of film thickness and PEB margin.

The results are set forth in Table 2.

COMPARATIVE EXAMPLE 5

The procedure of Example 6 was repeated to give a solution for a negative resist film except that salicylic acid was not incorporated to the solution. Using the thus-prepared solution for a negative film, a resist pattern was formed in the same manner as Example 6, and the obtained resist pattern was subjected to evaluation for definition (μm), the shape of resist pattern, change with the passage of time of sensitivity, change with the passage of time of film thickness and PEB margin. The results are indicated in Table 2.

COMPARATIVE EXAMPLE 6

A solution for a negative resist film was prepared in the same manner as Example 6 except that triethylamine was not added to the solution. Using the thus-prepared solution for a negative film, a resist pattern was formed in the same manner as Example 6, and the obtained resist pattern was subjected to evaluation for definition (μm), the shape of resist pattern, change with the passage of time of sensitivity, change with the passage of time of film thickness and PEB margin. The results are set forth in Table 2.

TABLE 2

| Example or Comparative Example | Definition | Shape of Resist Pattern | Change with Time of Sensitivity (%) | Change with Time of Film Thickness (%) | PEB Margin 107–110 (nm/° C.) | PEB Margin 110–113 (nm/° C.) |
| --- | --- | --- | --- | --- | --- | --- |
| Example 6 | 0.28 | Rectangular | 0.5 | 0.8 | 13 | 15 |
| Comparative Example 4 | 0.38 | Round | 1.5 | 3.2 | 35 | 38 |
| Comparative Example 5 | 0.30 | Rectangular | 0.5 | 1.2 | 16 | 18 |
| Comparative Example 6 | 0.38 | Round | 1.5 | 3.3 | 35 | 38 |

The present invention provides a chemical-amplification-type negative resist composition containing an alkali-soluble resin, a compound capable of generating an acid by irradiation and a crosslinking agent, and the resist composition of the present invention is characterized in that it further contains an organic carboxylic acid compound as an acidic compound and an organic amine compound as an alkaline compound. According to the content of such acidic and alkaline compounds, the negative resist composition achieves a negative resist pattern exhibiting improved definition and an excellent profile with a reduced dependency on the type of substrate. Furthermore, the negative resist composition achieves a minimized change in the sensitivety and film thickness with the passage of time and a satisfactory PEG margin. Therefore, the negative resist composition of the present invention can be used in the field of manufacturing electronic parts such as semiconductor devices and liquid-crystal display devices, where finer and more precise processing is increasingly required.

While the invention has been described in detail and with reference to specific embodiments thereof, it will be apparent to one of ordinary skill in the art that various changes and modifications can be made therein without departing from the spirit and scope thereof.

What is claimed is:

1. A chemical-amplification negative resist composition comprising:
   (A) an alkali-soluble resin;
   (B) a compound capable of generating an acid by irradiation; and
   (C) a crosslinking agent, wherein said composition further comprises:
   (D) an organic carboxylic acid compound; and
   (E) an organic amine compound.

2. The chemical-amplification negative resist composition according to claim 1 wherein the organic carboxylic acid compound (D) is at least one compound selected from the group consisting of benzoic acids.

3. The chemical-amplification negative resist composition according to claim 2 wherein the organic carboxylic acid compound (D) is at least one compound selected from the group consisting of o-hydroxybenzoic acid and o-nitrobenzoic acid.

4. The chemical-amplification negative resist composition according to claim 1 wherein the organic amine compound (E) is aliphatic secondary or tertiary amines having 2 to 6 carbon atoms.

5. The chemical-amplification negative resist composition according to claim 4 wherein the organic amine compound (E) is at least one compound selected from the group consisting of trimethylamine, triethylamine, tripropylamine, triisopropylamine, tributylamine, triisobutylamine, tri-tert-butylamine, tripentylamine, triisopentylamine, tri-tert-pentylamine, trihexylamine, diethylamine, dipropylamine, diisopropylamine and dibutylamine.

6. The chemical-amplification negative resist composition according to claim 1 wherein the total amounts of the organic carboxylic acid compound (D) and the organic amine compound (E) are 0.01 to 10 parts by weight relative to 100 parts by weight of the alkali-soluble resin (A) and the weight ratio of (D) : (E) is 10–90:90–10.

7. The chemical-amplification negative resist composition according to claim 1 wherein 0.5 to 20 parts by weight of the compound capable of generating an acid by irradiation (B) and 3 to 70 parts by weight of the crosslinking agent (C) relative to 100 parts by weight of the alkali-soluble resin (A) are used.

8. The chemical-amplification negative resist composition according to claim 1 wherein the alkali-soluble resin (A) is at least one resin selected from the group consisting of cresol-novolak resins, polyhydroxystyrenes, substituted polyhydroxystyrenes in which 1 to 45 mole % of hydrogen atoms of the hydroxyl groups of the original polyhydroxystyrene have been replaced with tert-butoxycarbonyl groups, and copolymers of p-hydroxystyrene and styrene.

9. The chemical-amplification negative resist composition according to claim 8 wherein the alkali-soluble resin (A) is a copolymer of p-hydroxystyrene and styrene.

10. The chemical-amplification negative resist composition according to claim 1 wherein the compound capable of generating an acid by irradiation (B) is tris(2,3-dibromopropyl)isocyanurate.

11. The chemical-amplification negative resist composition according to claim 1 wherein the compound capable of generating an acid by irradiation (B) is an oxime-sulfonate compound.

12. The chemical-amplification negative resist composition according to claim 11 wherein the compound capable of generating an acid by irradiation (B) is selected from the group consisting of α-(methylsulfonyloximino)-phenylacetonitrile, α-(methylsulfonyloximino)-4-methoxyphenylacetonitrile, α-(trifluoromethylsulfonyloximino)-phenylacetonitrile, α-(trifluoromethylsulfonyloximino)-4-methoxyphenylacetonitrile, α-(ethylsulfonyloximino)-4-methoxyphenylacetonitrile, α-(propylsulfonyloximino)-4-methylphenylacetonitrile, α-(methylsulfonyloximino)-4-bromophenylacetonitrile, α-(naphthylsulfonyloximino) benzylcyanide, α-(naphthylsulfonyloximino)-4-methoxyphenylacetonitrile, α-(camphorsulfonyloximino) benzylcyanide and α-(camphorsulfonyloximino) methoxybenzylcyanide.

13. The chemical-amplification negative resist composition according to claim 1 wherein the compound capable of generating an acid by irradiation (B) is a dicarboximide sulfonate-compound.

14. The chemical-amplification negative resist composition according to claim 13 wherein the compound capable of generating an acid by irradiation (B) is selected from the group consisting of N-(p-vinylphenyl) sulfonyloxysuccinimide, and N-(p-vinylphenyl) sulfonyloxymaleimide.

15. The chemical-amplification negative resist composition according to claim 1 wherein the crosslinking agent (C) is a melamine resin or urea resin in which at least one N position has been N-methylol-modified or N-alkoxymethyl-modified, or mixtures thereof.

* * * * *